US006995912B2

(12) United States Patent
Okazaki et al.

(10) Patent No.: US 6,995,912 B2
(45) Date of Patent: Feb. 7, 2006

(54) CONDENSING LENS, OPTICALLY-MULTIPLEXED-LASER-LIGHT SOURCE, AND EXPOSURE SYSTEM

(75) Inventors: Yoji Okazaki, Kaisei-machi (JP); Kazuhiko Nagano, Kaisei-machi (JP); Hiromitsu Yamakawa, Saitama (JP)

(73) Assignees: Fuji Photo Film Co., Ltd., Kanagawa-ken (JP); Fujinon Corporation, Saitama-ken (JP)

( * ) Notice: Subject to any disclaimer, the term of this patent is extended or adjusted under 35 U.S.C. 154(b) by 184 days.

(21) Appl. No.: 10/444,084

(22) Filed: May 23, 2003

(65) Prior Publication Data

US 2004/0247011 A1    Dec. 9, 2004

(30) Foreign Application Priority Data

May 23, 2002  (JP) .............................. 2002-149234

(51) Int. Cl.
  *G02B 27/10*    (2006.01)
  *G02B 27/30*    (2006.01)
  *H01S 3/10*    (2006.01)

(52) U.S. Cl. ...................... 359/619; 359/620; 359/626; 359/641; 372/9

(58) Field of Classification Search ................ 359/618, 359/619, 626, 641, 455, 741–743, 456, 620; 372/9, 92, 101, 69, 38.02; 385/42
See application file for complete search history.

(56) References Cited

U.S. PATENT DOCUMENTS

| 4,796,968 | A  | * | 1/1989 | Coccoli et al. ............... 385/42 |
| 5,369,661 | A  | * | 11/1994 | Yamaguchi et al. .......... 372/69 |
| 6,757,106 | B2 | * | 6/2004 | Kusuyama ................... 359/619 |
| 6,842,469 | B2 | * | 1/2005 | Nagara ..................... 372/38.02 |

OTHER PUBLICATIONS

Shuji Nakamra, et al./InGaN/AlGaN-Based Laser Diodes Grown on GaN Substrates with a Fundamental Transverse Mode/Jpn. J. Appl. Phys. vol. 37 (1998) pp. L 1020-L1022 Part 2, No. 9A/B, Sep. 15, 1998/Japanese Journal of Applied Physics.

* cited by examiner

*Primary Examiner*—Loha Ben
*Assistant Examiner*—Jack Dinh
(74) *Attorney, Agent, or Firm*—Sughrue Mion, PLLC (57) ABSTRACT

A condensing lens is integrally formed with collimator-lens portions which respectively collimate light beams and a condensing lens portion which makes the collimated light beams converge at a common point. In addition, an optically-multiplexed-laser-light source is constituted by semiconductor lasers, a multimode optical fiber, and the above condensing lens, where the collimator-lens portions in the condensing lens are respectively arranged in correspondence with the semiconductor lasers, and the condensing lens portion couples the light beams collimated by the collimator-lens portions, to the multimode optical fiber.

30 Claims, 9 Drawing Sheets

SPHERICAL ABERRATION OF 1ST SURFACE

FIG.4B

SPHERICAL ABERRATION OF 2ND SURFACE

DIRECTION OF WIND PRODUCED BY COOLING BLOWER 160

CONDENSING LENS, OPTICALLY-MULTIPLEXED-LASER-LIGHT SOURCE, AND EXPOSURE SYSTEM

BACKGROUND OF THE INVENTION

1. Field of the Invention

The present invention relates to a condensing lens which makes a plurality of divergent light beams converge at a common point.

The present invention also relates to an optically-multiplexed-laser-light source which utilizes optical fibers and optically multiplexes a plurality of laser beams emitted from a plurality of semiconductor lasers.

The present invention further relates to an exposure system which uses the above optically-multiplexed-laser-light source as a light source for exposure.

2. Description of the Related Art

Conventionally, in order to generate a laser beam having an ultraviolet wavelength, wavelength conversion lasers, excimer lasers, and Ar lasers are used. In the wavelength conversion lasers, infrared light emitted from a solid-state laser excited with a semiconductor laser is converted into a third harmonic having an ultraviolet wavelength.

Further, recently, GaN-based compound semiconductor lasers which emit a laser beam having a wavelength in the vicinity of 400 nm have been provided, for example, as disclosed in Japanese Journal of Applied Physics Part 2 Letters, vol. 37, 1998, p. L1020.

Light sources which emit laser beams having the wavelengths as mentioned above are considered to be used in exposure systems for exposure of photosensitive materials which are sensitive to light in a predetermined wavelength range including an ultraviolet wavelength range of 350 to 420 nm. In such a case, the light sources for exposure are required to have sufficient output power for exposing the photosensitive materials. The above predetermined wavelength range is hereinafter referred to as the ultraviolet range.

However, the excimer lasers are large in size, and the manufacturing costs and maintenance costs of the excimer lasers are high.

In the wavelength conversion lasers which convert infrared light into a third harmonic in the ultraviolet range, the wavelength conversion efficiency is very low. Therefore, it is very difficult to achieve high output power. In a typical wavelength conversion laser at the currently practical level, a solid-state laser medium is excited with a semiconductor laser having an output power of 30 W so as to output a fundamental harmonic having a wavelength of 1,064 nm and an output power of 10 W, the fundamental harmonic is converted into a second harmonic having a wavelength of 532 nm and an output power of 3 W, and a third harmonic having a wavelength of 355 nm (i.e., a sum frequency of the first and second harmonics) and an output power of 1 W is obtained. In this wavelength conversion laser, the efficiency in electric-to-optical conversion in the semiconductor laser is about 50%, and the efficiency in conversion to the ultraviolet light is as low as about 1.7%. In addition, since an optical wavelength conversion element is used in the above wavelength conversion laser, and the optical wavelength conversion element is expensive, the manufacturing cost of the wavelength conversion laser is high.

Further, the efficiency in electric-to-optical conversion in the Ar lasers is as low as 0.005%, and the lifetime thereof is as short as about 1,000 hours.

On the other hand, since it is difficult to obtain a low-dislocation GaN crystal substrate, an attempt has been made to achieve high output power and reliability in a GaN-based compound semiconductor laser. In the attempt, a low-dislocation region having a width of about 5 micrometers is produced by a growth method called ELOG (epitaxial lateral overgrowth), and a laser region is formed on the low-dislocation region. However, even in the attempt, it is difficult to obtain a low-dislocation substrate having a large area. Therefore, no GaN-based compound semiconductor laser having a high output power of 500 mW to 1 W has yet been commercialized.

In another attempt to increase output power of a semiconductor laser, for example, it has been considered to form a hundred cavities each of which outputs light with 100 mW so as to obtain a total output power of 10 W. However, it is almost unrealistic to manufacture as many as 100 cavities with high yield. In particular, it is difficult to manufacture GaN-based compound semiconductor lasers each having many cavities since manufacture of GaN-based compound semiconductor lasers with a high yield of 99% or greater is difficult even when the GaN-based compound semiconductor lasers each have a single cavity.

Therefore, it is possible to consider constituting an optically-multiplexed-laser-light source by a plurality of semiconductor lasers, a multimode optical fiber, and an optical condenser system which collects laser beams emitted from the plurality of semiconductor lasers, and couples the collected laser beams to the multimode optical fiber. If such an optically-multiplexed-laser-light source is realized, it is possible to emit a high-power optically-multiplexed laser beam from the multimode optical fiber.

Since the laser beams emitted from the semiconductor lasers are divergent light, the above optical condenser system is basically constituted by collimator lenses and a condensing lens, where each collimator lens collimates a laser beam emitted from one of the semiconductor lasers, and the condensing lens makes the light collimated by each collimator lens converge at a common point. However, in such an optical condenser system, bothersome operations are required for alignment among the collimator lenses and between the collimator lenses and the condensing lens. Therefore, when the optically-multiplexed-laser-light source is constituted by using such an optical condenser system, the manufacturing cost of the optically-multiplexed-laser-light source becomes considerably high.

SUMMARY OF THE INVENTION

The present invention has been developed in view of the above circumstances. It is an object of the present invention to provide a condensing lens which has a simple construction, and can make a plurality of divergent light beams converge at a common point.

Another object of the present invention is to provide an optically-multiplexed-laser-light source which can be produced at low cost by using a condensing lens which has a simple construction and can make a plurality of divergent light beams converge at a common point.

A further object of the present invention is to provide an exposure system which is constructed by using an optically-multiplexed-laser-light source, and can expose a photosensitive material to laser light having high intensity, where the optically-multiplexed-laser-light source can be produced at low cost by using a condensing lens which has a simple construction and can make a plurality of divergent light beams converge at a common point.

(I) According to the first aspect of the present invention, there is provided a condensing lens comprising: a plurality of collimator-lens portions which respectively collimate a plurality of light beams each of which is divergent; and a condensing lens portion which is integrally formed with the plurality of collimator-lens portions, and makes the plurality of light beams collimated by the plurality of collimator-lens portions converge at a common point.

The construction of the condensing lens according to the first aspect of the present invention is very simple. In addition, it is unnecessary to adjust the alignment between lenses. Therefore, it is easy to adjust alignment with a multimode optical fiber, semiconductor lasers, and the like in comparison with an optical condenser system in which a plurality of collimator lenses and a condensing lens are separately arranged.

The condensing lens according to the first aspect of the present invention can be used for producing an optically-multiplexed-laser-light source by combining with a plurality of semiconductor lasers and a multimode optical fiber. In addition, the condensing lens according to the first aspect of the present invention can be generally used in various applications in which a plurality of divergent light beams are required to converge at a common point.

Preferably, the condensing lens according to the first aspect of the present invention may also have one or any possible combination of the following additional features (i) and (ii).

(i) Each of the plurality of collimator-lens portions has a shape obtained by cutting an axially symmetric lens along at least one plane each being parallel to and not containing the optical axis of the axially symmetric lens so as to leave a portion of the axially symmetric lens containing the optical axis and having at least one planar end, and each adjacent pair of the plurality of collimator-lens portions are arranged so that planar ends of the adjacent pairs of the plurality of collimator-lens portions are in contact or in proximity with each other.

In this case, the plurality of collimator-lens portions can be arranged with a very small pitch. Therefore, when the condensing lens having the feature (i) is used in combination with a plurality of semiconductor lasers, it is possible to reduce the pitch with which the plurality of semiconductor lasers are arranged, and limit deviations of light beams emitted from the plurality of semiconductor lasers from a common convergence point, to a smaller amount.

(ii) The condensing lens portion has an elongated shape corresponding to a portion of an axially symmetric lens containing the optical axis of the axially symmetric lens, and the plurality of collimator-lens portions are arranged along a direction in which the condensing lens portion is elongated.

In this case, the entire size of the condensing lens can be remarkably reduced.

(II) According to the second aspect of the present invention, there is provided an optically-multiplexed-laser-light source comprising: a plurality of semiconductor lasers; a multimode optical fiber; and an optical condenser system which collects laser beams emitted from the plurality of semiconductor lasers, and couples the collected laser beams to the multimode optical fiber. The optical condenser system is realized by the condensing lens according to the first aspect of the present invention, where the plurality of collimator-lens portions in the condensing lens are respectively arranged in correspondence with the plurality of semiconductor lasers.

In the optically-multiplexed-laser-light source according to the second aspect of the present invention, the plurality of laser beams respectively emitted from the plurality of semiconductor lasers are collected and coupled to the multimode optical fiber by the condensing lens according to the first aspect of the present invention. Therefore, the construction of the optically-multiplexed-laser-light source according to the second aspect of the present invention is very simple. In addition, no constituent which is difficult to produce is used. Thus, the optically-multiplexed-laser-light source according to the second aspect of the present invention can be produced at low cost. Further, since the condensing lens according to the first aspect of the present invention, which eliminates the need for alignment between lenses, is used as an optical condenser system, alignment between the plurality of semiconductor lasers and the optical condenser system or between the optical condenser system and the multimode optical fiber is easy. Therefore, in this respect, the manufacturing cost can be further reduced.

Preferably, the optically-multiplexed-laser-light source according to the second aspect of the present invention may also have one or any possible combination of the following additional features (iii) to (x).

(iii) The plurality of semiconductor lasers contain active layers and emission points, the emission points of the plurality of semiconductor lasers are arranged along a line parallel to the active layers, and the plurality of collimator-lens portions each have an aperture which has a first diameter parallel to the line and a second diameter perpendicular to the line and greater than the first diameter.

In this case, it is possible to reduce the pitch with which the plurality of semiconductor lasers is arranged. That is, arrangement with higher density is enabled.

When the plurality of semiconductor lasers are arranged with high density as above, the misalignment of the plurality of laser beams at an end face of the multimode optical fiber can be limited to a smaller amount. Therefore, it is possible to relax requirements for alignment precision in assembly of the plurality of semiconductor lasers, the optical condenser system, and the multimode optical fiber. Further, since the alignment precision in the assembly can be relaxed as above, it is possible to increase the number of optically multiplexed laser beams and the output power for a reason which will be explained later.

(iv) The plurality of semiconductor lasers are mounted on a plurality of blocks which are joined (e.g., stuck together).

In this case, it is possible to increase the mounting yield of the semiconductor lasers in comparison with the case where all semiconductor lasers are mounted on a single block. For example, in the case where the mounting yield of a single semiconductor laser is 98%, the total mounting yield in the case where six semiconductor lasers are mounted on a single block is 89% (=$0.98^6 \times 100$). On the other hand, the total mounting yield in the case where three semiconductor lasers are mounted on each of two blocks becomes 94% (=$0.98^3 \times 100$) since almost 100% yield is realized in the step of joining the two blocks.

(v) The plurality of semiconductor lasers are arranged linearly, and the number of the plurality of semiconductor lasers is three to ten, and more preferably six or seven.

According to the polarization multiplex, which is conventionally known, laser beams from only two semiconductor lasers can be optically multiplexed. On the other hand, when the number of the semiconductor lasers arranged in the optically-multiplexed-laser-light source according to the second aspect of the present invention is three or greater, it is possible to obtain an optically multiplexed laser beam with higher output power than the optically multiplexed laser beam which is conventionally obtained. However, currently, the yield in the step of mounting a semiconductor laser is about 98%. When the yield in the step of mounting a semiconductor laser is 98%, the yield in the step of mounting ten semiconductor lasers is as low as 82%. Practically, a yield lower than 82% is not preferable. Therefore, based on the current yield in the step of mounting a semiconductor laser, the preferable upper limit of the number of the semiconductor lasers arranged in the optically-multiplexed-laser-light source according to the second aspect of the present invention is determined to be ten.

In the case where the multimode optical fiber having a core diameter not greater than 50 micrometers and a numerical aperture not greater than 0.3 or the multimode optical fiber in which the core diameter multiplied by the numerical aperture is not greater than 7.5 micrometers is used for image formation, and ten semiconductor lasers are arranged along a line, a mounting precision less than 0.1 micrometers is required. However, when the number of the semiconductor lasers arranged along a line is limited to six or seven, the requirement for the mounting precision is remarkably relaxed, and the required mounting precision becomes 0.3 to 1.0 micrometers. In addition, when the number of the semiconductor lasers is six or seven, the output power is doubled compared with the case of three semiconductor lasers.

(vi) Each of the plurality of semiconductor lasers has an emission width of 1 to 5 micrometers, and more preferably 2 to 3 micrometers.

(vii) Each of the plurality of semiconductor lasers is a GaN-based compound semiconductor laser.

For example, in the case of a GaN-based compound semiconductor laser, when each of the plurality of semiconductor lasers has an emission width of 1.5 micrometers or greater, the output power of each semiconductor laser (50 mW or greater) is higher than the maximum output power (about 30 mW) in a completely single transverse mode. On the other hand, in the case where the multimode optical fiber having a core diameter not greater than 50 micrometers and a numerical aperture not greater than 0.3 or the multimode optical fiber in which the core diameter multiplied by the numerical aperture is not greater than 7.5 micrometers is used for image formation, and each of the plurality of semiconductor lasers has an emission width of 5 micrometers or smaller, it is possible to construct an optical condenser coupling system corresponding to three or more semiconductor lasers. In particular, in the case where the above multimode optical fiber is used, and each of the plurality of semiconductor lasers has an emission width of 2 to 3 micrometers, it is possible to construct an optical condenser coupling system corresponding to six or seven semiconductor lasers.

(viii) The plurality of semiconductor lasers are fixed so that the plurality of semiconductor lasers are two-dimensionally arranged when viewed from a laser-receiving side.

In this case, a great number of semiconductor lasers can be arranged with high density. Therefore, it is possible to make a great number of laser beams enter a single multimode optical fiber, and obtain an optically multiplexed laser beam with higher output power.

(ix) The multimode optical fiber has a core diameter not greater than 50 micrometers and a numerical aperture not greater than 0.3.

In the fields of printing, medical imaging, formation of images for PCBs (printed circuit boards), PDPs (plasma display panels), LCDs (liquid crystal displays) in photosensitive materials by exposure, and the like, when the core diameter of the multimode optical fiber is not greater than 50 micrometers, it is possible to make the exposure spot very small and realize highly fine image exposure. In addition, when the numerical aperture of the multimode optical fiber is not greater than 0.3, it is possible to achieve a sufficient focal depth for the highly fine image exposure, i.e., to expose highly sharp images.

(x) The multimode optical fiber has a core diameter and a numerical aperture (NA), and the core diameter multiplied by the numerical aperture is not greater than 7.5 micrometers.

Conventionally, step index fibers having a core diameter of 50 micrometers and a numerical aperture of 0.2 are often used as multimode optical fibers. However, it is more preferable that the core diameter multiplied by the numerical aperture is not greater than 7.5 micrometers. For example, possible combinations of the core diameter and the numerical aperture are $50^{\mu m} \times 0.15$, $40^{\mu m} \times 0.188$, $30^{\mu m} \times 0.25$, and $25^{\mu m} \times 0.3$. When a multimode optical fiber in which the core diameter multiplied by the numerical aperture is not greater than 7.5 micrometers is used, the plurality of laser beams emitted from the plurality of semiconductor lasers can be collimated by the plurality of collimator-lens portions having a numerical aperture equivalent to the numerical aperture of the multimode optical fiber, and an optically multiplexed laser beam can be collected in a spot not greater than 25 micrometers by the condensing lens portion having a numerical aperture of 0.3. Therefore, it is possible to achieve high resolution and a sufficient focal depth.

(III) According to the third aspect of the present invention, there is provided an optically-multiplexed-laser-light source which comprises a plurality of optically-multiplexed-laser-light-source portions each having a construction identical to the optically-multiplexed-laser-light source according to the second aspect of the present invention. In this case, laser beams are emitted with high output power from the multimode optical fibers in the respective optically-multiplexed-laser-light-source portions.

Preferably, the optically-multiplexed-laser-light source according to the third aspect of the present invention may also have one or any possible combination of the following additional features (xi) and (xii).

(xi) The multimode optical fibers in the plurality of optically-multiplexed-laser-light-source portions are arranged to form a one-dimensional array or a bundle at least at the light-emitting end of the multimode optical fiber.

In this case, a plurality of high-power laser beams arranged in a one-dimensional array or a bundle can be emitted from the multimode optical fibers in the plurality of optically-multiplexed-laser-light-source portions. Therefore, it is possible to make each of the plurality of high-power laser beams enter one of modulation portions constituting a spatial light modulation element such as a GLV or DMD and being one or two-dimensionally arranged, and perform efficient modulation for image exposure or the like.

(xii) In the optically-multiplexed-laser-light source having the feature (xi), the multimode optical fiber has a reduced cladding diameter in a vicinity of the light-emitting end of the multimode optical fiber without change in the core diameter. In this case, it is possible to obtain an optically-multiplexed-laser-light source which can emit light with high intensity and output power. For example, when the cladding diameter of the portion of the multimode optical fiber other than the above vicinity is 125 micrometers, the cladding diameter in the vicinity may be reduced to about 60 micrometers.

When the optically-multiplexed-laser-light source having the feature (xii) is used as a light source for illumination of spatial light modulation elements such as DMDs (digital mirror devices) and GLVs (grating light valves) the focal depth and the resolution can be increased in comparison with the case where multimode optical fibers each having a uniform cladding diameter (e.g., 125 micrometers) are used.

(IV) According to the fourth aspect of the present invention, there is provided an exposure system which comprises, as light sources for exposure, a plurality of optically-multiplexed-laser-light sources each having a construction identical to the optically-multiplexed-laser-light source according to the second aspect of the present invention.

Preferably, in the exposure system according to the fourth aspect of the present invention, the multimode optical fibers in the plurality of optically-multiplexed-laser-light sources are arranged to form a one-dimensional array or a bundle.

In the above case, it is possible to form a two-dimensional image on a photosensitive material by using the aforementioned spatial light modulation element and exposing the photosensitive material to the plurality of laser beams which are emitted and two-dimensionally arranged, or by exposing a photosensitive material to the plurality of laser beams which are emitted and one or two-dimensionally arranged, and moving the photosensitive material relative to the plurality of laser beams so as to feed the photosensitive material.

DESCRIPTION OF THE PREFERRED EMBODIMENTS

Embodiments of the present invention are explained in detail below with reference to drawings.

First Embodiment

Figure 1:
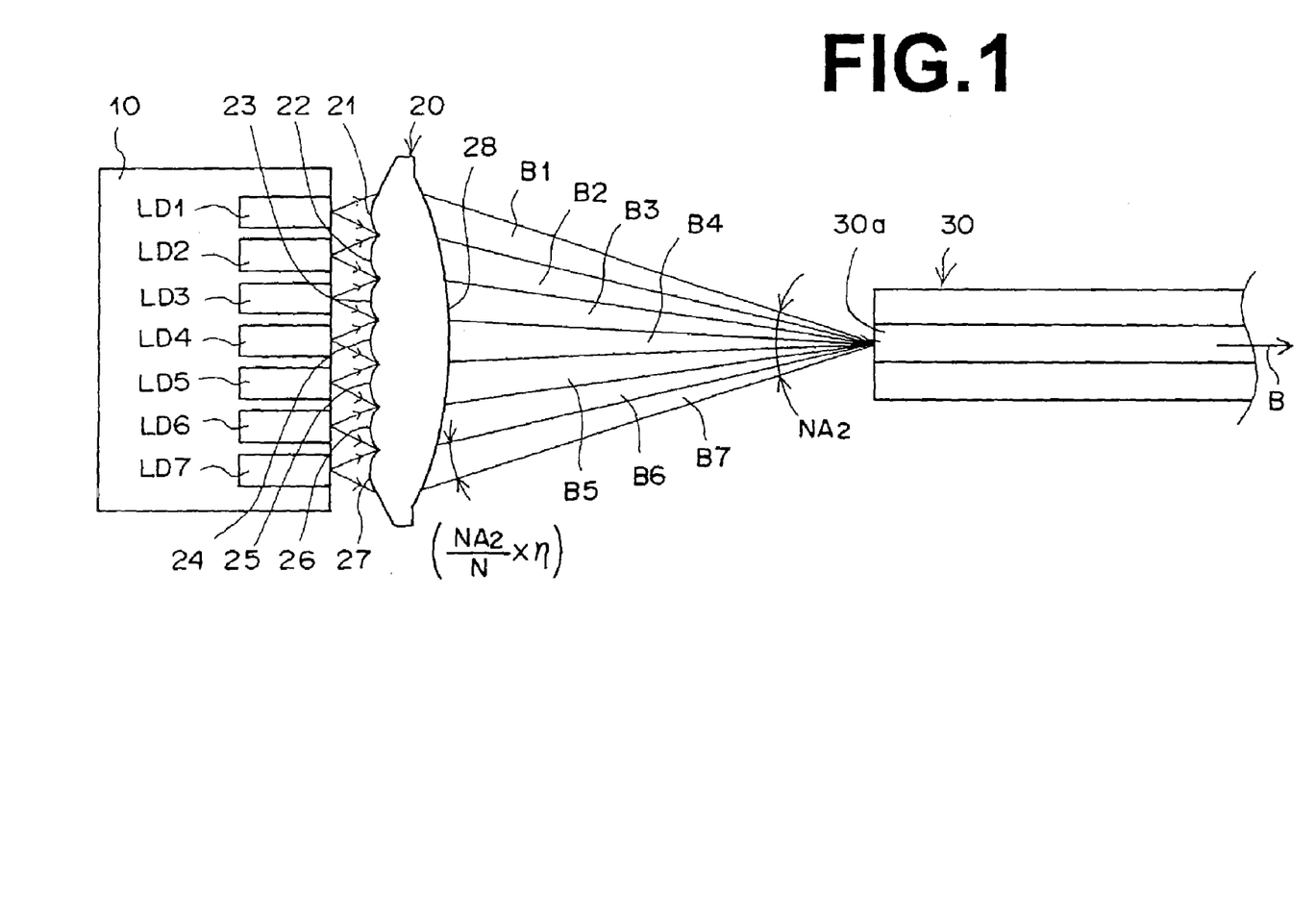
FIG. 1 is a plan view of an optically-multiplexed-laser-light source comprising a condensing lens according to a first embodiment of the present invention.
Figure 2:
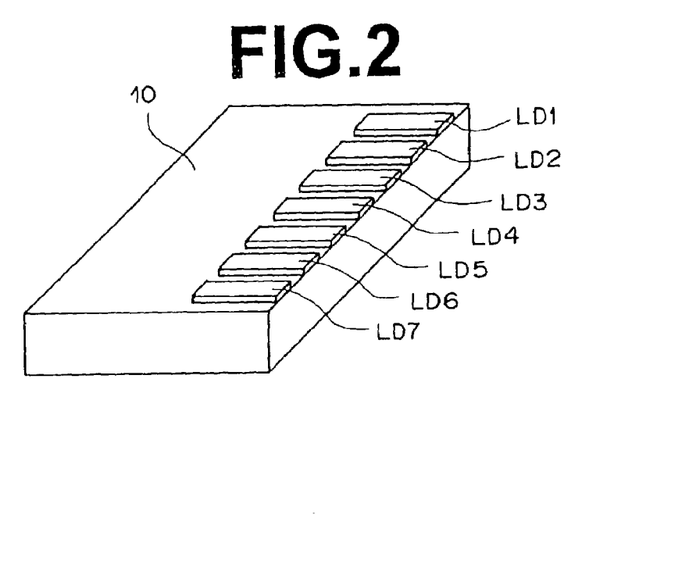
FIG. 2 is a perspective view of a portion that contains semiconductor lasers of the optically-multiplexed-laser-light source of FIG. 1.

FIG. 1 is a plan view of an optically-multiplexed-laser-light source comprising a condensing lens 20 according to the first embodiment of the present invention. As illustrated in FIG. 1, the optically multiplexed-laser-light source of FIG. 1 comprises GaN-based semiconductor laser chips LD1 through LD7, the condensing lens 20, and a multimode optical fiber 30. Each of the GaN-based semiconductor laser chips LD1 through LD7 operates in multiple transverse modes, and the number of the GaN-based semiconductor laser chips LD1 through LD7 is seven in the example of FIG. 1. The GaN-based semiconductor laser chips LD1 through LD7 are arranged and fixed on a heat block 10 made of copper as shown in FIG. 2.

FIGS. 3A through 3D are front, bottom, back, and side views of the condensing lens 20 of the first embodiment, respectively. The seven collimator-lens portions 21 through 27 and the condensing lens portion 28 in the condensing lens 20 are integrally formed out of an identical material. For example, the condensing lens 20 can be formed by molding from resin or optical glass.

Each of the outermost collimator lens portions 21 and 27 of the collimator-lens portions 21 through 27 has a shape obtained by cutting an axially symmetric lens along a plane being parallel to and not containing the optical axis of the axially symmetric lens so as to leave a portion of the axially symmetric lens containing the optical axis of the axially symmetric lens. Each of the other collimator-lens portions 22 through 26 has a shape obtained by cutting an axially symmetric lens along two parallel planes each being parallel to and not containing the optical axis of the axially symmetric lens so as to leave a portion of the axially symmetric lens being located between the two parallel planes and containing the optical axis of the axially symmetric lens, where the axially symmetric lenses used for obtaining the shapes of the collimator-lens portions 21 and 27 are identical. Each adjacent pair of the collimator-lens portions 21 through 27 abuts each other so as to share a plane.

The condensing lens portion 28 has a shape obtained by cutting an axially symmetric lens (which has a different shape from the above axially symmetric lens) along two parallel planes each being parallel to and not containing the optical axis of the axially symmetric lens so as to leave a portion of the axially symmetric lens being located between the two parallel planes and containing the optical axis of the axially symmetric lens. The collimator-lens portions 21 through 27 are arranged along the length of the condensing lens portion 28, and the optical axis of the collimator-lens portion 24 arranged in the center of the collimator-lens portions 21 through 27 coincides with the optical axis of the condensing lens portion 28.

The GaN-based semiconductor laser chips LD1 through LD7 have an identical oscillation wavelength of 405 nm and an identical maximum output power of 100 mW. The light emitted from each of the GaN-based semiconductor laser chips LD1 through LD7 is an elliptic light beam having a spread angle (full width at half maximum) of 30° in the major axis direction perpendicular to the plane of FIG. 1 and a spread angle (full width at half maximum) of 10° in the minor axis direction parallel to the plane of FIG. 1. The GaN-based semiconductor laser chips LD1 through LD7 are arranged so that the emission points of the GaN-based semiconductor laser chips LD1 through LD7 are respectively located on the optical axes of the collimator-lens portions 21 through 27, and the major axis direction coincides with the direction in which each of the collimator-lens portions 22 through 26 is elongated. That is, the GaN-based semiconductor laser chips LD1 through LD7 are arranged so that the emission points are aligned along a line parallel to active layers of the GaN-based semiconductor laser chips LD1 through LD7.

On the other hand, the multimode optical fiber 30 is formed by using a graded-index type optical fiber manufactured by Mitsubishi Cable Industries, Ltd as its base. The multimode optical fiber 30 has a graded-index type core and a step-index type cladding, where the core diameter is 25 micrometers, the numerical aperture (NA) is 0.3, and the transmittance of the end face coating is 99.5% or greater. In this example, the core diameter multiplied by the NA is 7.5 micrometers.

Divergent laser beams B1 through B7 emitted from the GaN-based semiconductor laser chips LD1 through LD7 are respectively collimated by the collimator-lens portions 21 through 27. Then, the collimated laser beams B1 through B7 are collected by the condensing lens portion 28, and converge on an entrance end face of the core 30a of the multimode optical fiber 30. In this example, an optical condenser system is constituted by the condensing lens 20, and an optical system for optical multiplex is constituted by the optical condenser system and the multimode optical fiber 30. Thus, the laser beams B1 through B7 collected by the condensing lens 20 as above enter and propagate in the core 30a of the multimode optical fiber 30, in which the laser beams B1 through B7 are optically multiplexed into a single laser beam B. Then, the laser beam B is output from the multimode optical fiber 30. The multimode optical fiber 30 may be a step-index type, a graded-index type, or any combination thereof.

In the construction of the first embodiment, the coupling efficiency of the laser beams B1 through B7 to the multimode optical fiber 30 is 0.9. Therefore, when the output power of each of the GaN-based semiconductor laser chips LD1 through LD7 is 100 mW, the output power of the optically multiplexed laser beam B becomes 630 mW(=100 mW×0.9×7).

As explained above, the laser beams B2 to B6 respectively enter the collimator-lens portions 22 through 26 in such a manner that the direction in which the spread angle of each of the laser beams B2 through B6 is maximized coincides with the direction of the greater diameter of the elongated aperture of each of the collimator-lens portions 22 through 26, and the direction in which the spread angle of each of the laser beams B2 through B6 is minimized coincides with the direction of the smaller diameter of the elongated aperture of each of the collimator-lens portions 22 through 26. Since the elliptic cross sections of the incident laser beams B2 through B6 fit well with the elongated shapes of the collimator-lens portions 22 through 26, it is possible to minimize portions of the apertures of the collimator-lens portions 22 through 26 which are not effectively used. In other words, the collimator-lens portions 22 through 26 can be efficiently used. In addition, to some degree, a similar advantage occurs in the collimator-lens portions 21 and 27. Alternatively, the collimator-lens portions 21 and 27 may also have the same shape as the collimator-lens portions 22 through 26.

Next, details of the condensing lens 20 having the above functions are explained. The condensing lens 20 is made of a glass material having a refractive index of 1.52811 at the wavelength of 405 nm. The condensing lens 20 has first and second surfaces, where the first surface is the surfaces of the collimator-lens portions 21 through 27, and the second surface is the surface of the condensing lens portion 28. Both of the first and second surfaces are aspheric surfaces. The thickness between the first and second surfaces is 2.5 mm. The first surface has a focal length of 3.0 mm and a numerical aperture (NA) of 0.6, and the first surface has a focal length of 14.6 mm and a numerical aperture (NA) of 0.3. Each of the collimator-lens portions 22 through 26 has a length (diameter) of 3.6 mm and a width of 1.1 mm. Each of the collimator-lens portions 21 and 27 contains a first portion which has an identical shape of each of the collimator-lens portions 22 through 26 and a second portion of the aforementioned axially symmetric lens.

Table 1 indicates aspheric coefficients of the first surface (s1) and the second surface (s2).

TABLE 1

| | Aspheric Coefficients | |
|---|---|---|
| | S1 | s2 |
| c | $6.3119 \times 10^{-1}$ | $-1.2964 \times 10^{-1}$ |
| k | $7.9928 \times 10^{-2}$ | $-3.7467 \times 10^{-1}$ |
| a4 | $-4.3538 \times 10^{-2}$ | $2.5838 \times 10^{-4}$ |
| a6 | $8.8648 \times 10^{-3}$ | $-2.7829 \times 10^{-6}$ |
| a8 | $-1.5026 \times 10^{-3}$ | $-2.9416 \times 10^{-8}$ |
| a10 | $1.1872 \times 10^{-4}$ | $1.5549 \times 10^{-9}$ |

In Table 1, c is a paraxial curvature, and k, a4, a6, a8, and a10 are aspheric coefficients. There is a relationship between the paraxial curvature c and the aspheric coefficients k, a4, a6, a8, and a10 as expressed by the equation (1), where z is a distance in the direction of the optical axis, and p is a distance from the surface vertex in the direction perpendicular to the optical axis.

$$z = \frac{c \cdot \rho^2}{1 + \sqrt{1 - k \cdot c^2 \cdot \rho^2}} + \sum_{i=2}^{5} a^i \cdot \rho^{2i} \quad (1)$$

Figure 4A:
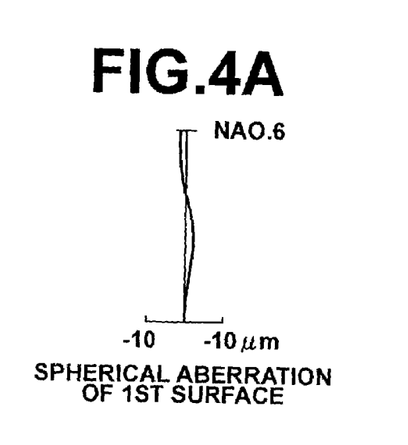
FIGS. 4A and 4B are aberration graphs indicating spherical aberration caused by the first and second surfaces, respectively.
Figure 4B:
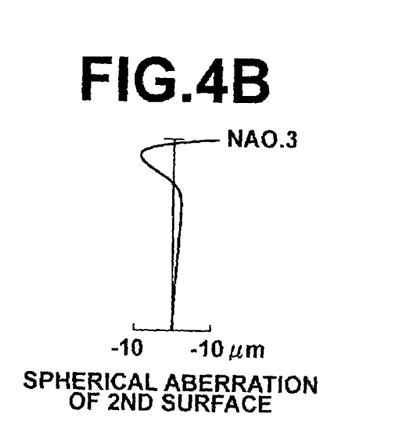

FIGS. 4A and 4B are aberration graphs indicating spherical aberration caused by the first and second surface surfaces, respectively. The spherical aberration caused by the first surface is spherical aberration which occurs on the light-source side (the side on which the GaN-based semiconductor laser chips LD1 through LD7 are arranged) when a parallel light beam is incident from the second-surface side, and the spherical aberration caused by the second surface is spherical aberration which occurs on the converging side (the side on which the multimode optical fiber 30 is arranged) when a parallel light beam is incident from the first-surface side.

Figure 3A:
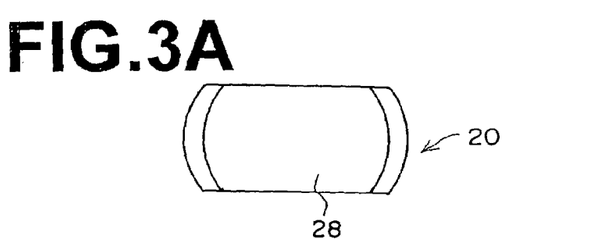
FIG. 3A is a front view of the condensing lens of the first embodiment.
Figure 3B:
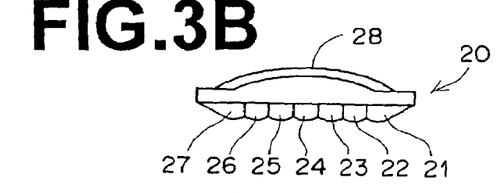
FIG. 3B is a bottom view of the condensing lens of the first embodiment.
Figure 3C:
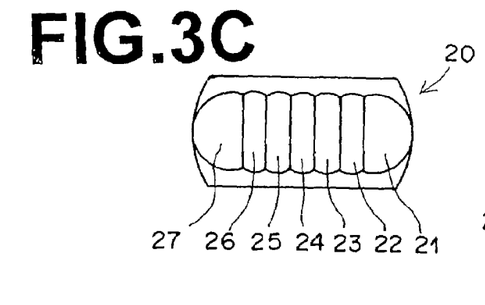
FIG. 3C is a back view of the condensing lens of the first embodiment.
Figure 3D:
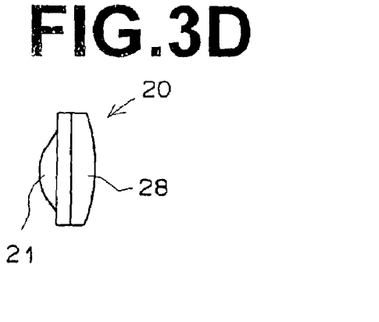
FIG. 3D is a side view of the condensing lens of the first embodiment.

Although the collimator-lens portions 21 through 27 may be arranged slightly spaced from each other, it is preferable that the collimator-lens portions 21 through 27 are arranged in contact with each other, i.e., each adjacent pair of the collimator-lens portions 21 through 27 abut each other so as to share a plane. In this case, the collimator-lens portions 21 through 27 can be arranged at a small pitch, and therefore it is possible to greatly increase the space utilization efficiency. When the space utilization efficiency is increased as above, it is possible to relax requirements for alignment precision in assembly of the GaN-based semiconductor laser chips LD1 through LD7, the optical condenser system, and the multimode optical fiber 30. The reason for this advantage will be explained in detail below.

Assume that the focal length and the numerical aperture of each of the collimator-lens portions 21 through 27 are respectively f1 and NA1, the focal length of the condensing lens portion 28 is $f_2$, the numerical aperture of the multimode optical fiber 30 is $NA_2$, and the space utilization efficiency is $\pi$. The space utilization efficiency $\pi$ is defined as a ratio of the space occupied by the optical paths of the seven laser beams B1 through B7 to the space between and including the laser beams B1 and B7. Therefore, when the optical paths of the seven laser beams B1 through B7 abut each other as illustrated in FIG. 1, $\pi=1$.

The magnifying power M of the lens system, i.e., the ratio of the diameter of the beam spot at the end face of the core of the multimode optical fiber 30 to the diameter of the beam spot at the emission point of each of the GaN-based semiconductor laser chips LD1 through LD7, is expressed by the following expression (2), where N is the number of the optically multiplexed laser beams.

$$M = \frac{f_2}{f_1} = \frac{NA_1}{\frac{NA_2}{N} \times \eta} = \frac{NA_1}{NA_2} \times \frac{N}{\eta} \quad (2)$$

As can be understood from the equation (2), the magnifying power M decreases with an increase in the space utilization efficiency $\pi$. In addition, the distances over which the laser beams B1 through B7 move on the end face of the core of the multimode optical fiber 30 when the relative misalignment among the GaN-based semiconductor laser chips LD1 through LD7, the condensing lens 20, and the multimode optical fiber 30 occurs decreases with decrease in the magnifying power M. Therefore, in the case where the space utilization efficiency $\pi$ is great, the magnifying power M is small, and therefore it is possible to make the laser beams B1 through B7 normally enter the core 30a in the multimode optical fiber 30 even when the alignment precision in assembly of the GaN-based semiconductor laser chips LD1 through LD7, the condensing lens 20, and the multimode optical fiber 30 is relatively low. When the alignment precision in the assembly can be relaxed as above, it is possible to further increase the number of optically multiplexed laser beams and the output power. Since the magnifying power M decreases when the space utilization efficiency $\pi$ is increased, increase in the magnifying power M caused by the increase in the number of optically multiplexed laser beams can be compensated for, and therefore it is possible to increase the number of optically multiplexed laser beams.

Although the number of optically multiplexed laser beams in the optically-multiplexed-laser-light source in the first embodiment is seven, the number of optically multiplexed laser beams may be any number greater then one. However, the preferred numbers of the optically multiplexed laser beams are as explained before.

In the case where a plurality of semiconductor lasers are arranged along a line and fixed on a support member such as a heat block, it is possible to form a stack of a plurality of support members on each of which a plurality of semiconductor lasers are fixed, so as to two-dimensionally arrange a great number of semiconductor lasers.

That is, in the case where a great number of semiconductor lasers are two-dimensionally arranged when viewed from the laser-receiving side, the great number of semiconductor lasers can be arranged with high density. Therefore, it is possible to make the great number of laser beams enter the multimode optical fiber and obtain an optically-multiplexed laser beam with higher output power.

Figure 5:
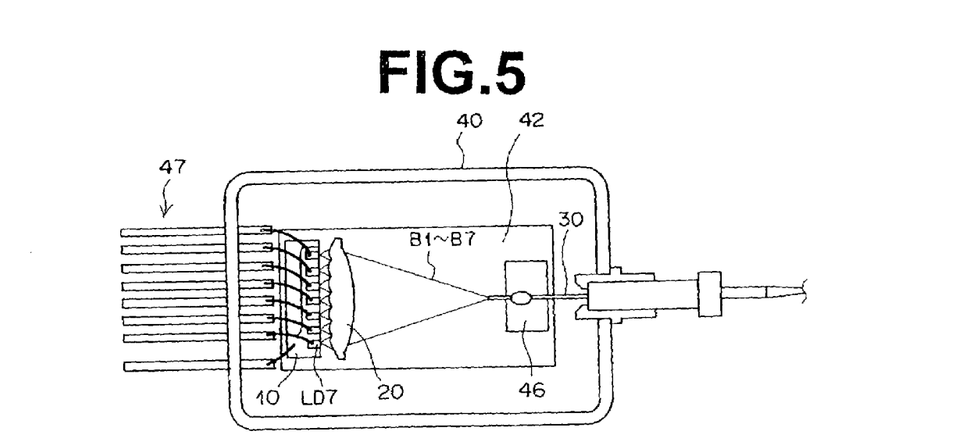
FIG. 5 is a plan view of a high-intensity ultraviolet-light optically-multiplexing fiber module comprising the optically-multiplexed-laser-light source of FIG. 1.
Figure 6:
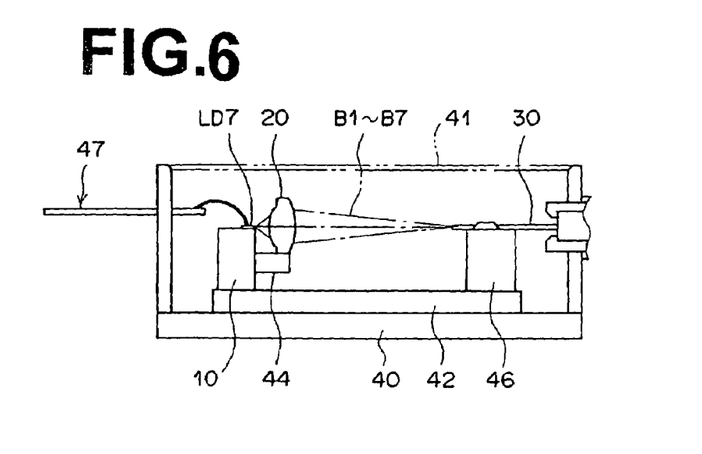
FIG. 6 is a side view of the high-intensity ultraviolet-light optically-multiplexing fiber module of FIG. 5.

Next, a high-intensity ultraviolet-light optically-multiplexing fiber module constituted by the optically-multiplexed-laser-light source illustrated in FIG. 1 will be explained in detail. FIGS. 5 and 6 are plan and side views of a high-intensity ultraviolet-light optically-multiplexing fiber module. In FIGS. 5 and 6, in order to simplify the illustration, the reference numbers of the GaN-based semiconductor laser chips LD1 through LD6 are not shown.

In this example, optical elements constituting the high-intensity ultraviolet-light optically-multiplexing fiber module are contained in a box type package 40. When the package 40 has an opening on its top side, and the opening is closed with a cover 41, the high-intensity ultraviolet-light optically-multiplexing fiber module is hermetically sealed and held within the closed space realized by the package 40 and the cover 41.

A base plate 42 is fixed on the inner bottom surface of the package 40, the aforementioned heat block 10 is fixed on the upper surface of the base plate 42, and a lens holder 44 for holding the condensing lens 20 is fixed to the heat block 10. In addition, a fiber holder 46 for holding the entrance end of the multimode optical fiber 30 is fixed to the upper surface of the base plate 42. Further, wirings 47 for supplying driving currents to the GaN-based semiconductor laser chips LD1 through LD7 are led out of the package 40 through openings formed in a sidewall of the package 40.

Figure 7:
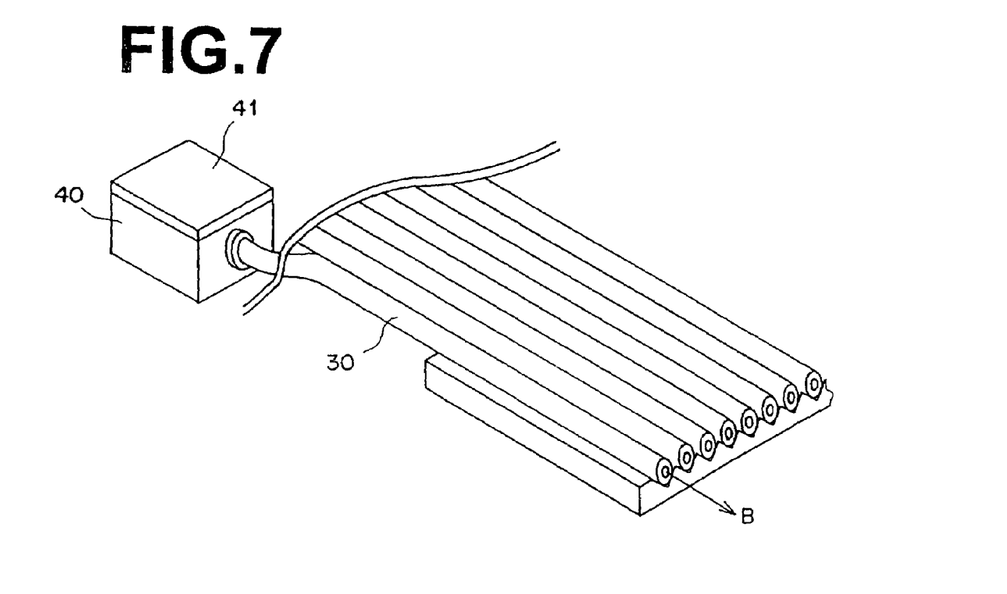
FIG. 7 is a perspective view of a light-source apparatus comprising a plurality of optically-multiplexed-laser-light-source portions each of which is identical to that of FIG. 1.

As illustrated in FIG. 7, it is possible to arrange in a one-dimensional array light-emission ends of a plurality of multimode optical fibers each having an identical construction to the above multimode optical fiber 30 so as to form a light source which emits a high-intensity ultraviolet-light laser beam B from each of the plurality of multimode optical fibers. Specifically, when sixteen multimode optical fibers each of which emits an optically-multiplexed laser beam B with an output power of 630 mW are arranged, it is possible to realize an extremely high total output power of 10 W and a high optical density of 5 W/mm(=10 W/(125 μm×16)). At this time, the energy efficiency is as high as about 15%, which is equivalent to the emission efficiency of the GaN-based compound semiconductor lasers.

Second Embodiment

Next, a condensing lens according to the second embodiment of the present invention will be explained below. FIGS. 8A, 8B, 8C, and 8D are front, bottom, back, and side views of a condensing lens 50 according to the second embodiment of the present invention, respectively. As illustrated in FIGS. 8A, 8B, 8C, and 8D, the condensing lens 50 comprises twelve collimator-lens portions arranged in two lens arrays and a single condensing lens portion 53, where the twelve collimator-lens portions and the condensing lens portion 53 in the condensing lens 50 are integrally formed out of an identical material. Each of the two lens arrays is constituted by two collimator-lens portions 51 being located on both ends of the lens array and each having a similar shape to each of the two collimator-lens portions 21 and 27 illustrated in FIGS. 3A to 3D and four collimator-lens portions 52 being located between the two collimator-lens portions 51 and each having a similar shape to each of the collimator-lens portions 22 through 26 illustrated in FIGS. 3A to 3D.

Figure 8A:
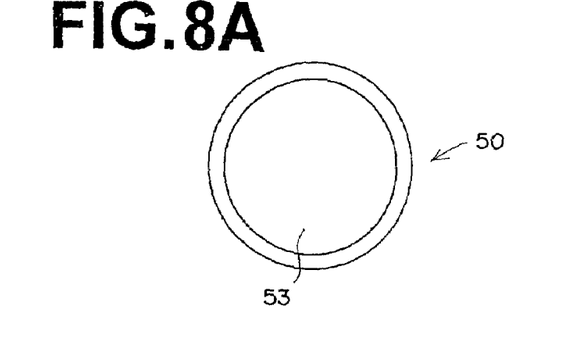
FIG. 8A is a front view of a condensing lens according to a second embodiment of the present invention.
Figure 8B:
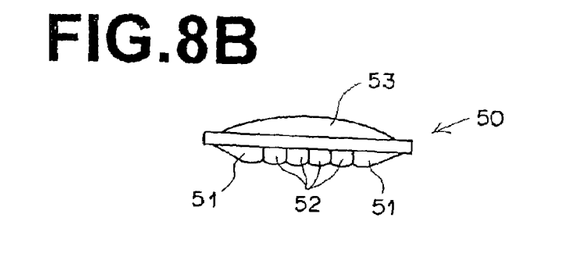
FIG. 8B is a bottom view of the condensing lens of the second embodiment.
Figure 8C:
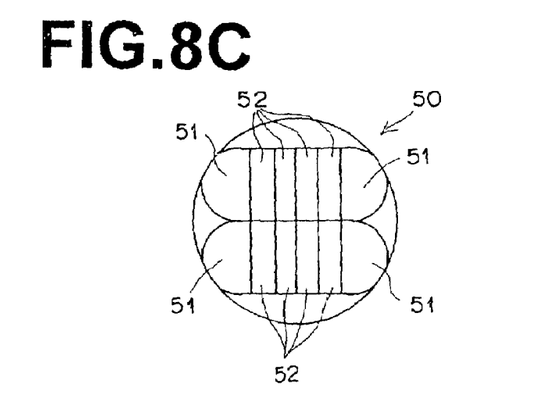
FIG. 8C is a back view of the condensing lens of the second embodiment.
Figure 8D:
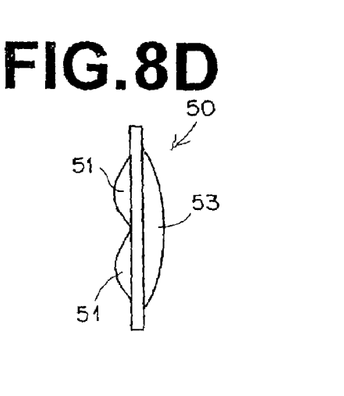
FIG. 8D is a side view of the condensing lens of the second embodiment.

The condensing lens 50 having the above construction can be used in combination with a great number of semiconductor lasers which are two-dimensionally arranged, for example, as mentioned before.

Third Embodiment

Next, a condensing lens according to the third embodiment of the present invention will be explained below. FIGS. 9A, 9B, 9C, and 9D are front, bottom, back, and side views of a condensing lens 60 in the third embodiment of the present invention. As illustrated in FIGS. 9A, 9B, 9C, and 9D, the condensing lens 60 comprises eleven collimator-lens portions and a single condensing lens portion 63, where the eleven collimator-lens portions and the condensing lens portion 63 in the condensing lens 60 are integrally formed out of an identical material. Seven collimator-lens portions out of the eleven collimator-lens portions constitute a lens array which is constituted by two collimator-lens portions 61 being located on both ends of the lens array and each having a similar shape to each of the two collimator-lens portions 21 and 27 illustrated in FIGS. 3A to 3D and five collimator-lens portions 62 being located between the two collimator-lens portions 61 and each having a similar shape to each of the collimator-lens portions 22 through 26 illustrated in FIGS. 3A to 3D. In addition, a first additional collimator-lens portion 62 having a similar shape to each of the collimator-lens portions 22 through 26 illustrated in FIGS. 3A to 3D and a second additional collimator-lens portion having a similar shape to each of the two collimator-lens portions 21 and 27 illustrated in FIGS. 3A to 3D are arranged on each lateral side of the above lens array, where the second additional collimator-lens portion is located outermost.

Figure 9A:
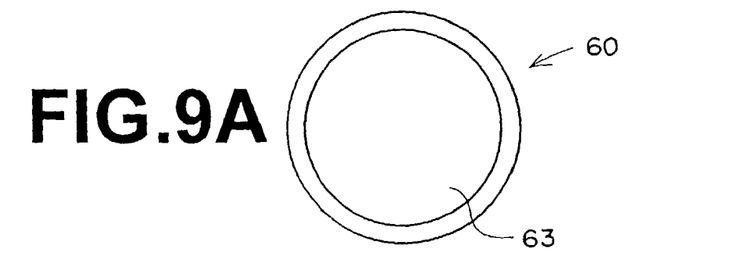
FIG. 9A is a front view of a condensing lens according to a third embodiment of the present invention.
Figure 9B:
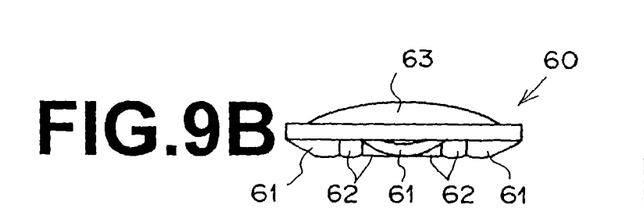
FIG. 9B is a bottom view of the condensing lens of the third embodiment.
Figure 9C:
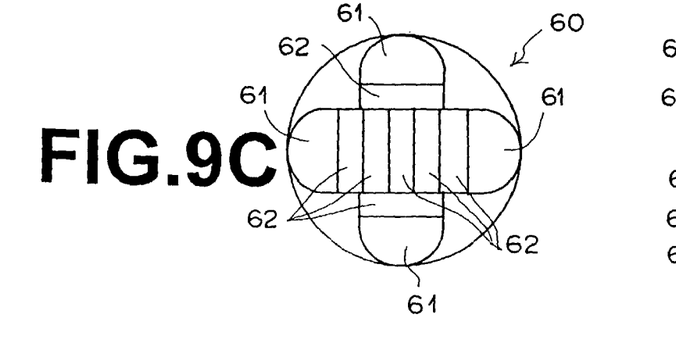
FIG. 9C is a back view of the condensing lens of the third embodiment.
Figure 9D:
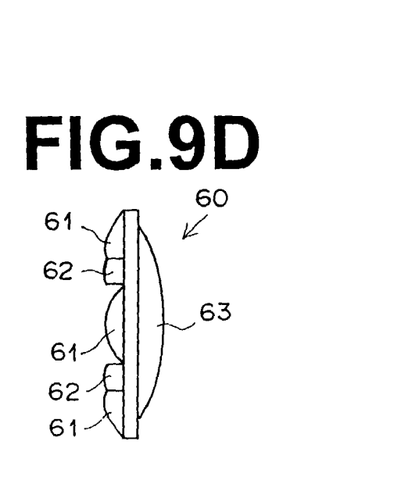
FIG. 9D is a side view of the condensing lens of the third embodiment.

The condensing lens 60 having the above construction can also be used in combination with a great number of semiconductor lasers which are two-dimensionally arranged as mentioned before.

The shapes of the collimator-lens portions and the condensing lens portion constituting the condensing lens according to the present invention are not limited to the shapes in the first to third embodiments, and the collimator-lens portions and the condensing lens portion can have various other shapes. For example, each of the collimator-lens portions and the condensing lens portion can have an axially symmetric shape. Alternatively, it is possible to form the condensing lens portion into an elongated shape and the collimator-lens portions into an axially symmetric shape.

Image Exposure System

Next, an image exposure system using the high-intensity ultraviolet-light optically-multiplexing fiber module illustrated in FIGS. 5 and 6 will be explained with reference to FIGS. 10 to 14.

Figure 10:
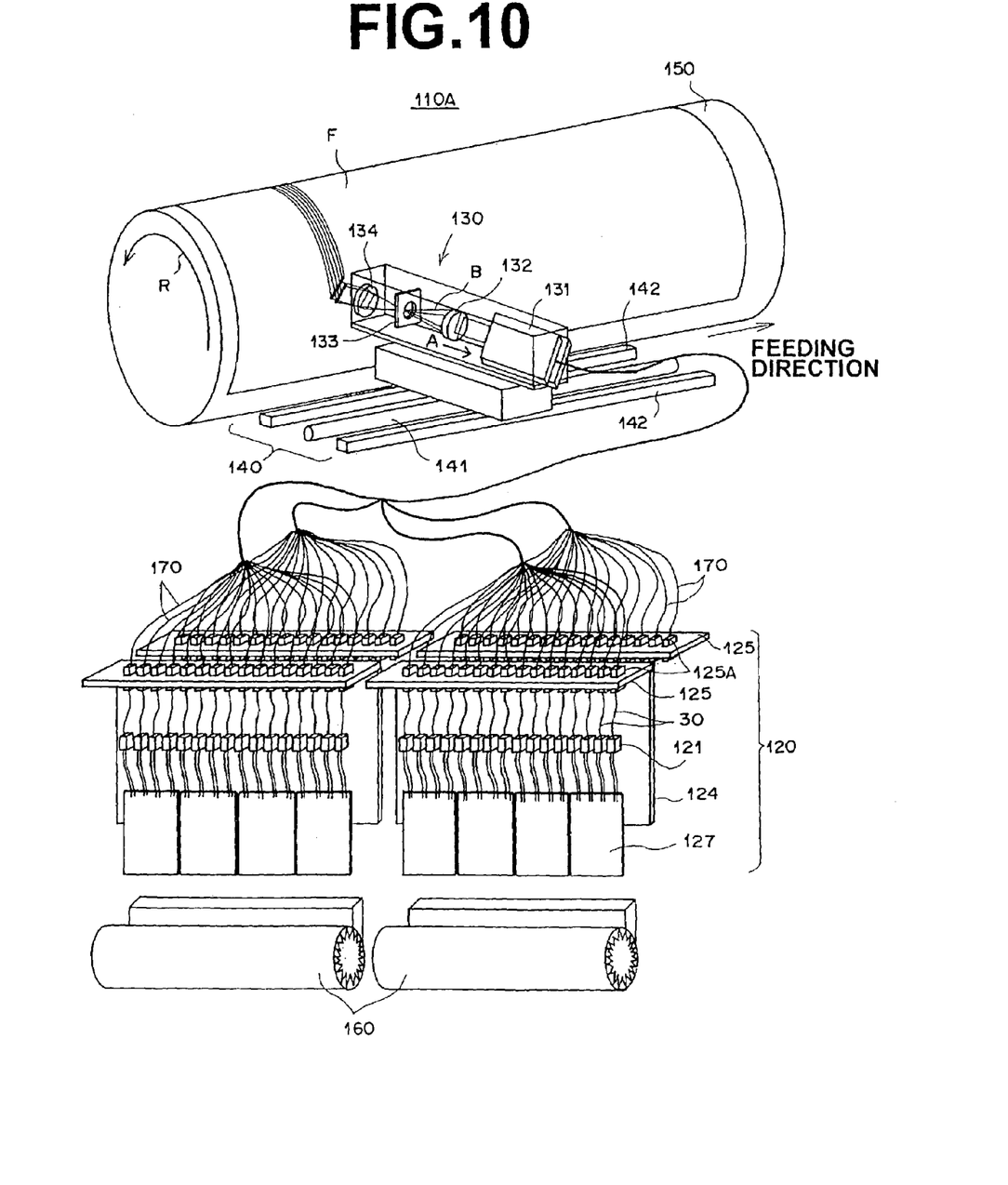
FIG. 10 is a perspective view of an image exposure system according to a fourth embodiment of the present invention.

FIG. 10 shows the entire construction of an image exposure system 110A. As illustrated in FIG. 10, the image exposure system 110A comprises a light source unit 120, an exposure head 130, an exposure-head movement unit 140, a drum 150, and a cooling blower 160. The light source unit 120 generates a plurality of laser beams. The exposure head 130 collects the plurality of laser beams generated by the light source unit 120. The exposure-head movement unit 140 moves the exposure head 130 in the sub scanning direction. A recording medium F in which an image is to be recorded is placed around the drum 150, and the drum 150 is rotationally driven in the direction of the arrow R indicated in FIG. 10 so that the recording medium F moves in the main scanning direction. The cooling blower 160 produces wind (cooling wind) mainly for cooling the light source unit 120.

The recording medium F is a flexible recording material which can be placed around the drum 150. Specifically, the recording medium F is a photosensitive or thermosensitive film, a photosensitive or thermosensitive plate for printing, or the like. Alternatively, the present invention can also be applied to an arrangement in which the drum 150 per se is photosensitive or thermosensitive, and no recording medium F is placed around the drum 150.

Figure 11:
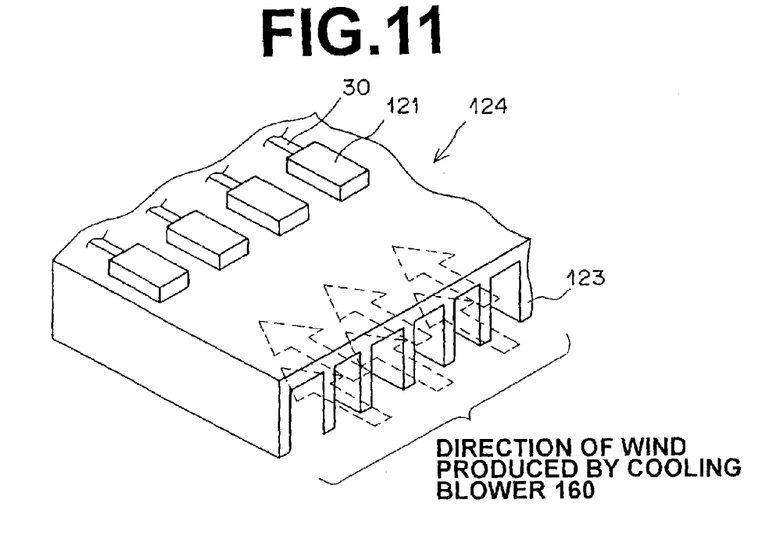
FIG. 11 is a perspective view of a portion of the image exposure system of FIG. 10.

The light source unit 120 comprises a light-source board 124, an adapter board 125, and an LD-driver board 127. A plurality of optically-multiplexing fiber modules 121 are arranged on the front side of the light-source board 124, and heat-dissipation fins 123 are arranged on the back surface of the light-source board 124, as illustrated in FIG. 11, which is a perspective view of a portion of the image exposure system of FIG. 10. Each of the optically-multiplexing fiber modules 121 has the construction illustrated in FIGS. 5 and 6, and emits high-intensity ultraviolet laser light.

The adapter board 125 is attached to one end of the light-source board 124 so that the adapter board 125 is arranged perpendicular to the light-source board 124, and a plurality of adapters for SC optical connectors 125A are arranged on the adapter board 125, where the number of the plurality of adapters is identical to the number of the plurality of optically-multiplexing fiber modules 121. The LD-driver board 127 is attached to the other end of the light-source board 124 so that the LD-driver board 127 is arranged parallel to the light-source board 124. An LD driver circuit 126 (indicated in FIG. 13) which drives the plurality of optically-multiplexing fiber modules 121 according to image data representing the image to be recorded in the recording medium F is mounted on the LD-driver board 127.

Ends of a plurality of multimode optical fibers 30 located on one side are respectively connected to the plurality of optically-multiplexing fiber modules 121, and plugs for the SC optical connectors 125A are arranged at the other ends of the plurality of multimode optical fibers 30 on the opposite side. The plugs are inserted into jacks provided on a first side of the plurality of adapters on the adapter board 125. Therefore, laser beams emitted from the plurality of optically-multiplexing fiber modules 121 are transmitted through the plurality of multimode optical fibers 30 to approximately the center positions of the plurality of adapters on the adapter board 125.

The LD driver circuit 126 on the LD-driver board 127 has output terminals for signals which drive the plurality of optically-multiplexing fiber modules 121, and the output terminals are respectively connected to the corresponding optically-multiplexing fiber modules 121. Thus, the operations of the plurality of optically-multiplexing fiber modules 121 are individually controlled by the LD driver circuit 126.

In the exposure head 130, a fiber array unit 131 is arranged. The fiber array unit 131 collects the laser beams B emitted from the plurality of optically-multiplexing fiber modules 121, and emits the collected laser beams. The laser beams are transmitted from the plurality of optically-multiplexing fiber modules 121 to the fiber array unit 131 through a plurality of multimode optical fibers 170. Plugs for the SC optical connectors are provided at ends of the plurality of multimode optical fibers 170 located on one side, and the plugs are inserted into jacks provided on a second side of the plurality of adapters on the adapter board 125.

Figure 12:
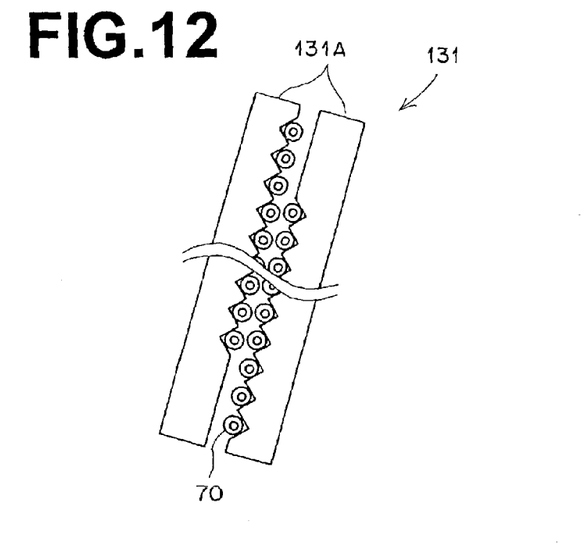
FIG. 12 is a front view of a portion of the image exposure system of FIG. 10.

FIG. 12 shows the fiber array unit 131 viewed from the direction of the arrow A indicated in FIG. 10. As illustrated in FIG. 12, the fiber array unit 131 is constituted by a pair of bases 131A. A plurality of V-grooves are formed on one side of each of the pair of bases 131A at predetermined intervals, and the pair of bases 131A are arranged so that the sides on which the V-grooves are formed are opposed to each other. The total number of the V-grooves formed on the pair of bases 131A is the number of the plurality of optically-multiplexing fiber modules 121, and each of the other ends of the multimode optical fibers 170 is set in one of the V-grooves. Thus, the plurality of laser beams emitted from the respective optically-multiplexing fiber modules 121 can be output concurrently from the ends of the multimode optical fibers 170 positioned at the predetermined intervals in the fiber array unit 131.

In addition, as illustrated in FIG. 10, in the exposure head 130, a collimator lens 132, an aperture element 133, and an image-forming lens 134 are arranged in this order following the fiber array unit 131. The aperture element 133 is arranged so that the aperture in the aperture element 133 is located at a far field position when viewed from the laser-beam emitting end of the fiber array unit 131. Thus, it is possible to equally exert a light-amount limitation effect on all of the laser beams B emitted from the laser-emitting ends of the multimode optical fibers 170 in the fiber array unit 131.

On the other hand, the exposure-head movement unit 140 comprises a bore screw 141 and two rails 142 which are arranged in the sub scanning direction. The exposure head 130 is engaged with a portion of the bore screw 141, and the bore screw 141 is rotationally driven by a sub scanning motor 143 (indicated in FIG. 13). Thus, it is possible to move the exposure head 130 in the sub scanning direction along the rails 142 by activating the sub scanning motor 143.

When a main scanning motor 151 (indicated in FIG. 13) is activated, the drum 150 is rotationally driven in the direction indicated by the arrow R in FIG. 10. Thus, the main scanning is realized.

As illustrated in FIGS. 10 and 11, the cooling blower 160 is oriented so that the cooling wind produced by the cooling blower 160 blows on the heat-dissipation fins 123 in the light-source board 124 and all of the multimode optical fibers 30. Therefore, the cooling wind produced by the cooling blower 160 can suppress temperature rise during operation of the optically-multiplexing fiber modules 121, and can forcedly vibrate the respective multimode optical fibers 30.

Figure 13:
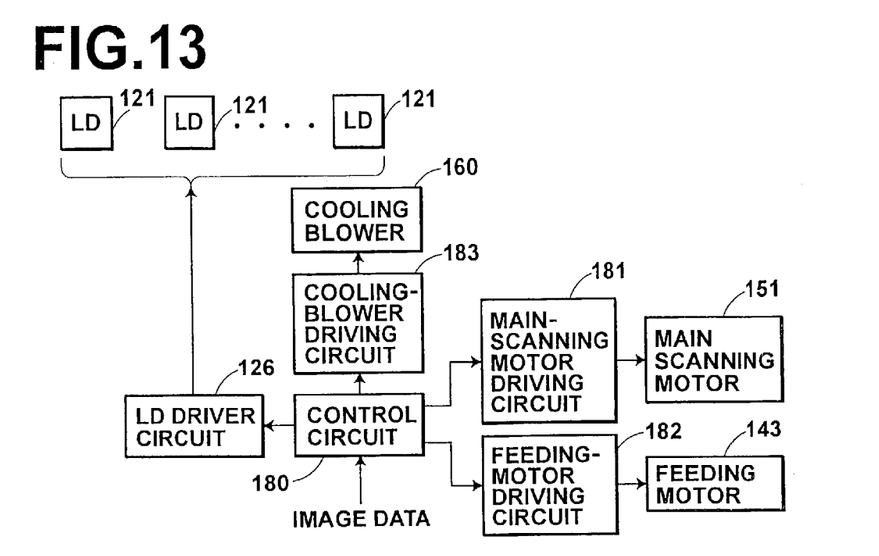
FIG. 13 is a block diagram illustrating a control system for electrically controlling the image exposure system of FIG. 10.

Next, a construction of a control system for the image exposure system 110A will be explained with reference to FIG. 13. As illustrated in FIG. 13, the control system comprises the LD driver circuit 126, a main-scanning-motor driving circuit 181, a sub scanning-motor driving circuit 182, a cooling-blower driving circuit 183, and a control circuit 180. The LD driver circuit 126 drives the optically-multiplexing fiber modules 121 according to the image data to be recorded in the recording medium F. The main-scanning-motor driving circuit 181 drives the main scanning motor 151. The sub scanning-motor driving circuit 182 drives the sub scanning motor 143. The cooling-blower driving circuit 183 drives the cooling blower 160. The control circuit 180 controls the LD driver circuit 126, the main-scanning-motor driving circuit 181, the sub scanning-motor driving circuit 182, and the cooling-blower driving circuit 183. The image data to be recorded in the recording medium F is supplied to the control circuit 180.

Figure 14:
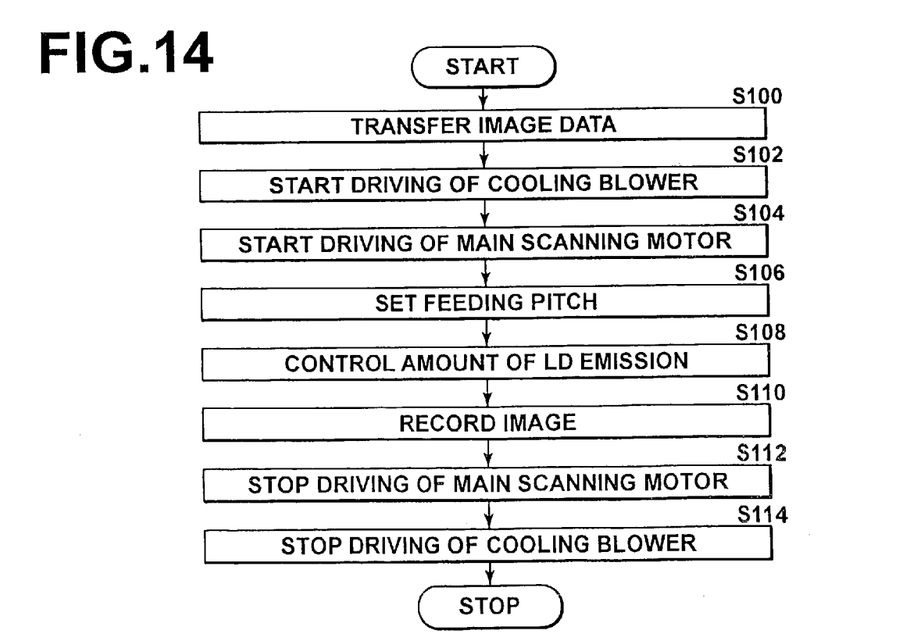
FIG. 14 is a flow chart indicating a sequence of processing relating to image exposure.

Hereinbelow, the operations of the image exposure system 110A are explained with reference to FIG. 14, which is a flow chart indicating the sequence of processing performed when the image exposure system 110A records an image.

First, in step S100, image data representing an image to be recorded in the recording medium F is transferred from an image memory for temporarily storing image data representing an image to be recorded (not shown) to the control circuit 180. The control circuit 180 supplies signals which are adjusted based on the transferred image data and resolution data, to the LD driver circuit 126, the main-scanning-motor driving circuit 181, and the sub scanning-motor driving circuit 182, where the resolution data indicates a resolution predetermined for the image to be recorded.

Then, in step S102, the control circuit 180 controls the cooling-blower driving circuit 183 so as to start the operation of the cooling blower 160. Thus, the operation for cooling the optically-multiplexing fiber modules 121 with the cooling wind produced by the cooling blower 160, and the vibrations of the mutimode optical fibers 30 are started.

At this time, it is possible to reduce unevenness of the image recorded in the recording medium F when the vibrations of the multimode optical fibers 30 can randomize variations in the amount of light emitted from the multimode optical fibers 30. Therefore, in this embodiment, an air flow rate which can cause the above vibrations and is sufficient for cooling the heat-dissipation fins 123 is empirically determined based on an experiment, a computer simulation, or the like, and the cooling-blower driving circuit 183 controls the operation of the cooling blower 160 so that the predetermined air flow rate is realized.

Next, in step S104, the main-scanning-motor driving circuit 181 controls the main scanning motor 151 based on one of the signals supplied from the control circuit 180, so that the drum 150 rotates in the direction of the arrow R indicated in FIG. 10 at a rotation speed corresponding to the resolution data. Then, in step S106, the sub scanning-motor driving circuit 182 sets a sub scanning pitch based on the resolution data, where the exposure head 130 is moved in the sub scanning direction by the sub scanning motor 143 with the sub scanning pitch.

Subsequently, in step S108, the LD driver circuit 126 controls the operation of the optically-multiplexing fiber modules 121 according to the image data.

The plurality of laser beams B emitted from the optically-multiplexing fiber modules 121 pass through the multimode optical fibers 30, the SC optical connectors 125A, and the multimode optical fibers 170, and are output from the fiber array unit 131. Then, the laser beams B are collimated by the collimator lens 132, and the light amounts of the laser beams B are limited by the aperture element 133. Finally, the laser beams B pass through the image-forming lens 134, and converge on the recording medium F on the drum 150.

In the above case, a plurality of beam spots corresponding to the plurality of laser beams B are formed on the recording medium F. When the exposure head 130 is fed in the sub scanning direction at the sub scanning pitch set in step S106, and the drum 150 rotates under the control started in step S104, the above beam spots expose the recording medium F in step S110 so as to record a two-dimensional image on the recording medium F with the resolution indicated by the resolution data.

When the recording of the two-dimensional image on the recording medium F is completed, the main-scanning-motor driving circuit 181 stops the rotational driving of the main scanning motor 151 in step S112, and the control circuit 180 controls the cooling-blower driving circuit 183 so as to stop the operation of the cooling blower 160 in step S114. Thus, the processing of FIG. 14 is completed.

According to the above processing, a two-dimensional image can be recorded on the recording medium F with a predetermined resolution, and the cooling blower 160 is driven during the image recording operation so that the multimode optical fibers 30 are randomly vibrated, and noise similar to white noise can be superimposed on the laser beams propagated through the multimode optical fibers 30. Thus, it is possible to prevent occurrence of unevenness (such as swath-type or beat-type unevenness) of the recorded two-dimensional image.

In addition, all of the contents of the Japanese patent application No. 2002-149234 are incorporated into this specification by reference.

What is claimed is:

1. A condensing lens comprising:

a plurality of collimator-lens portions which respectively collimate a plurality of light beams each of which is divergent; and a condensing lens portion which is integrally formed with said plurality of collimator-lens portions, and makes the plurality of light beams collimated by the plurality of collimator-lens portions converge at a common point, wherein each of said plurality of collimator-lens portions has a shape obtained by cutting an axially symmetric lens along at least one plane each being parallel to and not containing an optical axis of the axially symmetric lens so as to leave a portion of the axially symmetric lens containing the optical axis and having at least one planar end, and each adjacent pair of the plurality of collimator-lens portions are arranged so that planar ends of said each adjacent pair of the plurality of collimator-lens portions are in contact or proximity with each other.

2. A condensing lens according to claim 1, wherein said condensing lens portion has an elongated shape corresponding to a portion of an axially symmetric lens containing an optical axis of the axially symmetric lens, and said plurality of collimator-lens portions are arranged along a direction in which the condensing lens portion is elongated.

3. The condensing lens of claim 1, wherein the plurality of collimator-lens portions and the condensing lens portion are formed out of an identical material.

4. The condensing lens of claim 1, wherein a first surface corresponds to outer surfaces of the plurality of collimator-lens portions and a second surface corresponds to an outer surface of the condensing lens portion, the first surface and the second surface are aspherical surfaces.

5. The condensing lens of claim 1, wherein the plurality of collimator-lens portions are arranged as a two-dimensional lens array.

6. An optically-multiplexed-laser-light source comprising:

a plurality of semiconductor lasers;

a multimode optical fiber; and an optical condenser system which collects laser beams emitted from said plurality of semiconductor lasers, couples the collected laser beams to said multimode optical fiber, and is realized by an integrally formed condensing lens containing, a plurality of collimator-lens portions which are respectively arranged in correspondence with said plurality of semiconductor lasers, and respectively collimate a plurality of light beams each of which is divergent, and a condensing lens portion which collects the plurality of light beams collimated by the plurality of collimator-lens portions, and makes the plurality of light beams converge at a common point, wherein each of said plurality of collimator-lens portions has a shape obtained by cutting an axially symmetric lens along at least one plane each being parallel to and not containing an optical axis of the axially symmetric lens so as to leave a portion of the axially symmetric lens containing the optical axis and having at least one planar end, and each adjacent pair of the plurality of collimator-lens portions are arranged so that planar ends of said each adjacent pair of the plurality of collimator-lens portions are in contact or proximity with each other.

7. An optically-multiplexed-laser-light source according to claim 6, wherein said plurality of semiconductor lasers contain active layers and emission points, the emission points of the plurality of semiconductor lasers are arranged along a line parallel to the active layers, and said plurality of collimator-lens portions each have an aperture which has a first diameter parallel to said line and a second diameter perpendicular to said line and greater than the first diameter.

8. An optically-multiplexed-laser-light source according to claim 6, wherein said plurality of semiconductor lasers are mounted on a plurality of blocks which are joined.

9. An optically-multiplexed-laser-light source according to claim 6, wherein said plurality of semiconductor lasers are arranged along a line, and the number of the plurality of semiconductor lasers is three to ten.

10. An optically-multiplexed-laser-light source according to claim 6, wherein said plurality of semiconductor lasers are arranged along a line, and the number of the plurality of semiconductor lasers is six or seven.

11. An optically-multiplexed-laser-light source according to claim 6, wherein each of said plurality of semiconductor lasers has an emission width of 1 to 5 micrometers.

12. An optically-multiplexed-laser-light source according to claim 6, wherein each of said plurality of semiconductor lasers has an emission width of 2 to 3 micrometers.

13. An optically-multiplexed-laser-light source according to claim 6, wherein each of said plurality of semiconductor lasers is a GaN-based compound semiconductor laser.

14. An optically-multiplexed-laser-light source according to claim 6, wherein said plurality of semiconductor lasers are fixed so that the plurality of semiconductor lasers are two-dimensionally arranged when viewed from a laser-receiving side.

15. An optically-multiplexed-laser-light source according to claim 6, wherein said multimode optical fiber has a core diameter not greater than 50 micrometers and a numerical aperture not greater than 0.3.

16. An optically-multiplexed-laser-light source according to claim 6, wherein said multimode optical fiber has a core diameter and a numerical aperture, and the core diameter multiplied by the numerical aperture is not greater than 7.5 micrometers.

17. The optically-multiplexed-laser-light source of claim 6, wherein the plurality of collimator-lens portions and the condensing lens portion are formed out of an identical material.

18. The optically-multiplexed-laser-light source of claim 6, wherein a first surface corresponds to outer surfaces of the plurality of collimator-lens portions and a second surface corresponds to an outer surface of the condensing lens portion, the first surface and the second surface are aspherical surfaces.

19. The optically-multiplexed-laser-light source of claim 6, wherein the plurality of collimator-lens portions are arranged as a two-dimensional lens array.

20. An optically-multiplexed-laser-light source comprising a plurality of optically-multiplexed-laser-light-source portions, each including:
   a plurality of semiconductor lasers;
   a multimode optical fiber; and
   an optical condenser system which collects laser beams emitted from said plurality of semiconductor lasers, couples the collected laser beams to said multimode optical fiber, and is realized by an integrally formed condensing lens containing,
   a plurality of collimator-lens portions which are respectively arranged in correspondence with said plurality of semiconductor lasers, and respectively collimate a plurality of light beams each of which is divergent, and
   a condensing lens portion which collects the plurality of light beams collimated by the plurality of collimator-lens portions, and makes the plurality of light beams converge at a common point,
   wherein each of said plurality of collimator-lens portions has a shape obtained by cutting an axially symmetric lens along at least one plane each being parallel to and not containing an optical axis of the axially symmetric lens so as to leave a portion of the axially symmetric lens containing the optical axis and having at least one planar end, and each adjacent pair of the plurality of collimator-lens portions are arranged so that planar ends of said each adjacent pair of the plurality of collimator-lens portions are in contact or proximity with each other.

21. An optically-multiplexed-laser-light source according to claim 20, wherein said multimode optical fiber in the plurality of optically-multiplexed-laser-light-source portions is arranged to constitute a one-dimensional array or a bundle at least at a light-emitting end of the multimode optical fiber.

22. An optically-multiplexed-laser-light source according to claim 21, wherein said multimode optical fiber has a reduced cladding diameter in a vicinity of said light-emitting end of the multimode optical fiber without change in a core diameter.

23. The optically-multiplexed-laser-light source of claim 20, wherein the plurality of collimator-lens portions and the condensing lens portion are formed out of an identical material.

24. The optically-multiplexed-laser-light source of claim 20, wherein a first surface corresponds to outer surfaces of the plurality of collimator-lens portions and a second surface corresponds to an outer surface of the condensing lens portion, the first surface and the second surface are aspherical surfaces.

25. The optically-multiplexed-laser-light source of claim 20, wherein the plurality of collimator-lens portions are arranged as a two-dimensional lens array.

26. An exposure system comprising a plurality of optically-multiplexed-laser-light sources each of which is provided for exposure and includes:
   a plurality of semiconductor lasers;
   a multimode optical fiber; and
   an optical condenser system which collects laser beams emitted from said plurality of semiconductor lasers, couples the collected laser beams to said multimode optical fiber, and is realized by an integrally formed condensing lens containing,
   a plurality of collimator-lens portions which are respectively arranged in correspondence with said plurality of semiconductor lasers, and respectively collimate a plurality of light beams each of which is divergent, and
   a condensing lens portion which collects the plurality of light beams collimated by the plurality of collimator-lens portions, and makes the plurality of light beams converge at a common point,
   wherein each of said plurality of collimator-lens portions has a shape obtained by cutting an axially symmetric lens along at least one plane each being parallel to and not containing an optical axis of the axially symmetric lens so as to leave a portion of the axially symmetric lens containing the optical axis and having at least one planar end, and each adjacent pair of the plurality of collimator-lens portions are arranged so that planar ends of said each adjacent pair of the plurality of collimator-lens portions are in contact or proximity with each other.

27. An exposure system according to claim 26, wherein said multimode optical fiber in the plurality of optically-multiplexed laser-light sources is arranged to constitute a one-dimensional array or a bundle.

28. The exposure system of claim 26, wherein the plurality of collimator-lens portions and the condensing lens portion are formed out of an identical material.

29. The exposure system of claim 26, wherein a first surface corresponds to outer surfaces of the plurality of collimator-lens portions and a second surface corresponds to an outer surface of the condensing lens portion, the first surface and the second surface are aspherical surfaces.

30. The exposure system of claim 26, wherein the plurality of collimator-lens portions are arranged as a two-dimensional lens array.

* * * * *